United States Patent [19]

Fukutome et al.

[11] Patent Number: 5,601,293
[45] Date of Patent: Feb. 11, 1997

[54] SLIDING MEMBER WITH HARD TERNERY FILM

[75] Inventors: Hiroto Fukutome, Okaya; Nobuyuki Yamashita; Shoji Tanaka, both of Shiojiri, all of Japan

[73] Assignee: Teikoku Piston Ring Co., Ltd., Tokyo, Japan

[21] Appl. No.: 575,329

[22] Filed: Dec. 20, 1995

[30] Foreign Application Priority Data

Dec. 22, 1994 [JP] Japan .................................. 6-336265
Jan. 19, 1995 [JP] Japan .................................. 7-024729

[51] Int. Cl.$^6$ ........................................................ F16J 9/26
[52] U.S. Cl. ........................................................ 277/235 A
[58] Field of Search ...................... 277/235 A, DIG. 6; 428/549, 552, 553, 679

[56] References Cited

U.S. PATENT DOCUMENTS

| | | | |
|---|---|---|---|
| 3,690,686 | 9/1972 | Prasse et al. | 277/235 A |
| 3,988,119 | 10/1976 | Takahashi et al. | 277/235 A |
| 4,407,515 | 10/1983 | Naito | 277/DIG. 6 |
| 4,681,817 | 7/1987 | Shinada | 277/235 A |
| 4,873,150 | 10/1989 | Doi et al. | |
| 4,944,663 | 7/1990 | Iizuka et al. | |
| 4,966,751 | 10/1990 | Kaede et al. | |
| 5,104,132 | 4/1992 | Onada et al. | 277/235 A |
| 5,295,696 | 3/1994 | Harayama et al. | 277/235 A |

FOREIGN PATENT DOCUMENTS

| | | | |
|---|---|---|---|
| 57-57867 | 4/1982 | Japan . | |
| 1-41649 | 2/1989 | Japan | 277/235 A |
| 2-134468 | 5/1990 | Japan . | |
| 6-17933 | 1/1994 | Japan . | |
| 6-25826 | 2/1994 | Japan . | |
| 2243162 | 10/1991 | United Kingdom . | |
| 2259715 | 3/1993 | United Kingdom . | |
| 2276176 | 9/1994 | United Kingdom . | |

OTHER PUBLICATIONS

Japio Abstract of JP 6025826A.
WPI Accession No. 86–247746/38 and JP 61174362A (Toyota) Abstract.

*Primary Examiner*—Scott Cummings
*Attorney, Agent, or Firm*—Armstrong, Westerman, Hattori, McLeland, & Naughton

[57] ABSTRACT

A hard film is formed on the outer circumferential surface of a piston ring by means of a physical vapor deposition process. The hard film is a ternary film comprising molybdenum, chromium, and 4 to 22 percent nitrogen by weight, and includes at least molybdenum nitride and chromium nitride. The film has a Vickers hardness of 1400 to 2600, and the crystal grain size of the film is less than 1 μm.

3 Claims, 17 Drawing Sheets

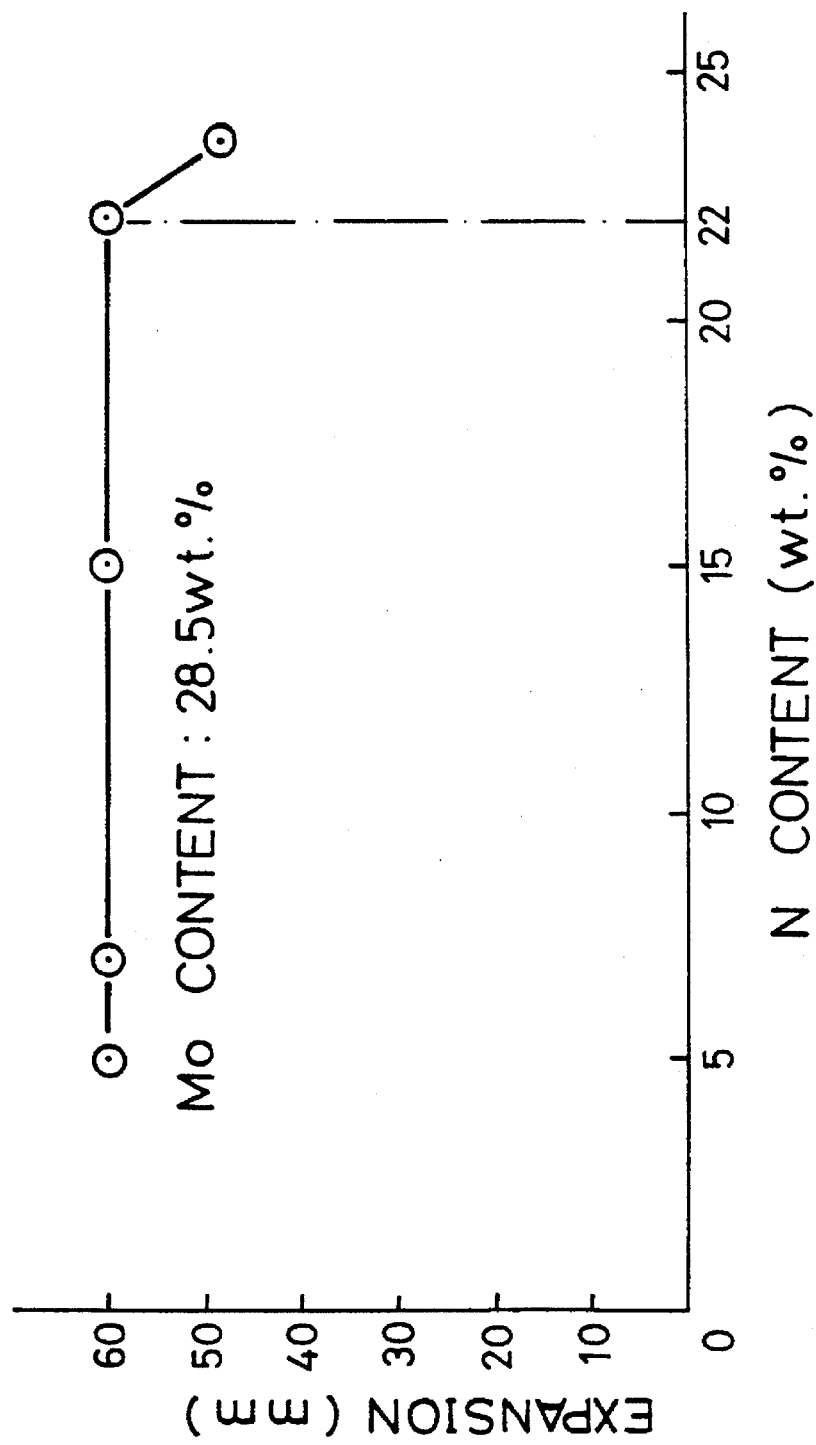

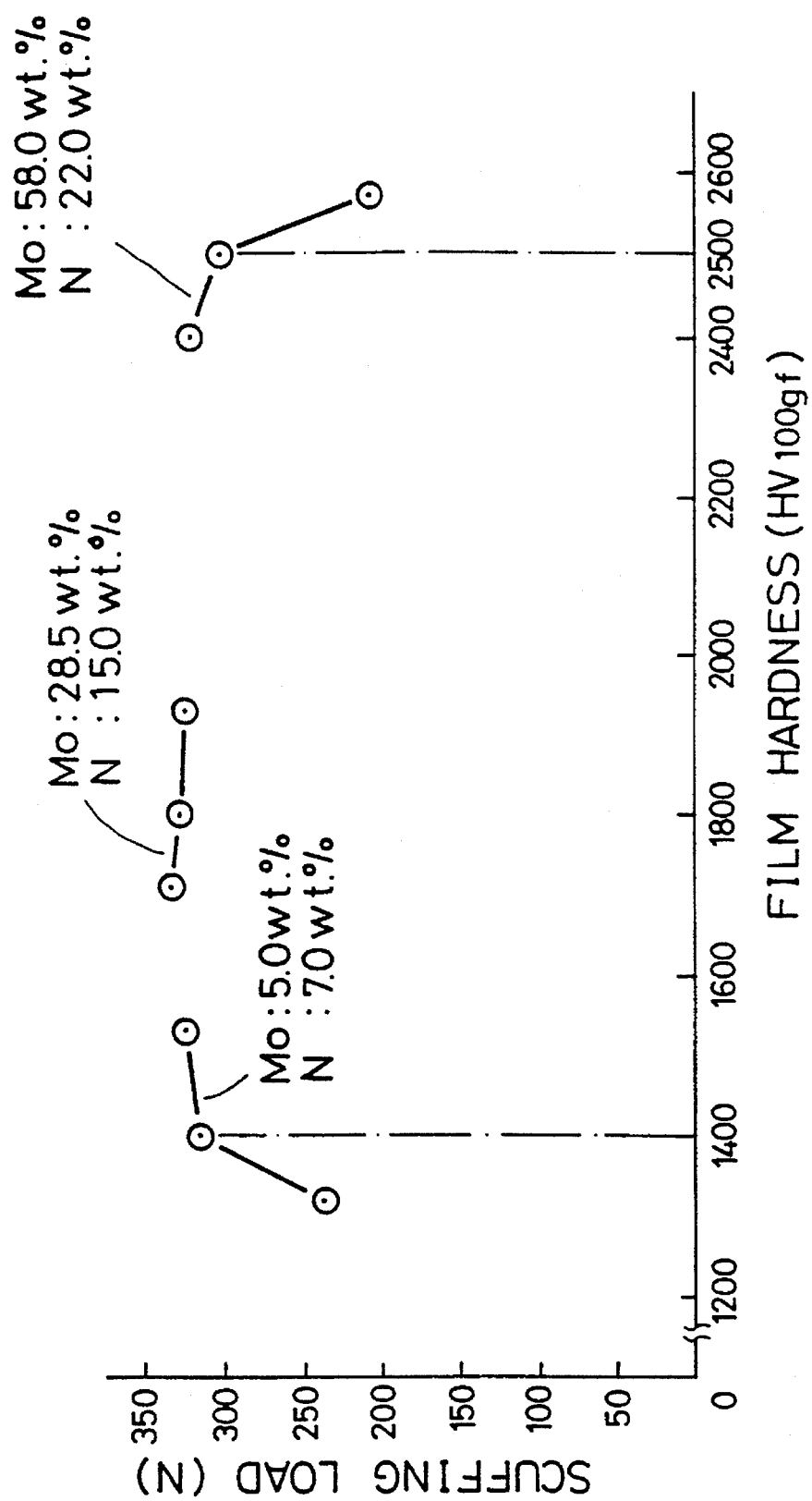

SLIDING MEMBER WITH HARD TERNERY FILM

BACKGROUND OF THE INVENTION

1. Field of the Invention

This invention relates to sliding members having superior wear resistance, toughness and adhesion, and is effective when applied to sliding members such as piston rings used in internal combustion engines.

2. Description of the Related Art

In recent years, piston rings have been subject to the increasingly harsh operating environments due to higher engine outputs and changes to meet exhaust emission regulations. Many engines which were processed with conventional surface treatments such as hard chromium plating and nitriding for surface processing of sliding surfaces, are not durable enough to withstand this harsh environment.

To respond to this problem, piston rings covered with a film of titanium nitride or chromium nitride which can be thickened using physical vapor deposition have been proposed (see Japanese Patent Laid-open No. 57-57867). Further, piston rings covered with a film of molybdenum nitride having wear resistance superior to chromium nitride have been proposed (Japanese Patent Laid-open No. 2-134468, Japanese Patent Laid-open No. 6-17933, and Japanese Patent Laid-open No. 6-25826), in order to extend the piston ring operating life.

Thermal sprayed films are known which contain hard particles consisting of carbide, nitride or oxide dispersed within molybdenum metal. However these films have a composite structure containing hard particles or metallic particles of 1 μm or more and have poor resistance to peeling at the sliding portions and poor film adhesion.

The chromium nitride film has insufficient wear resistance. Although the molybdenum nitride film is extremely hard with superior wear resistance, its brittleness may result in the generation of cracks or chips on the film due to repeated excessive stress from sliding movement, so that the cracks or chips may eventually lead to peeling.

SUMMARY OF THE INVENTION

It is an object of this invention to provide a sliding member covered with a hard film having superior wear resistance, toughness and adhesion, and a manufacturing method thereof.

This invention is a sliding member having a hard film covering at least the sliding surfaces of said sliding member. The said hard film is a ternary film comprising molybdenum, chromium, and 4 to 22 percent nitrogen by weight, and includes at least molybdenum nitride and chromium nitride. The film has a Vickers hardness of 1400 to 2600, and the crystal grain size of the film is less than 1 μm.

BRIEF DESCRIPTION OF THE DRAWINGS

The aforesaid and other objects and features of the present invention will become more apparent from the following detailed description and the accompanying drawings.

FIG. 16 is a graph showing the relation of nitrogen content to the amount of expansion.

FIG. 17 is a graph showing the relation of film hardness to scuffing load.

DESCRIPTION OF THE PREFERRED EMBODIMENTS

Figure 1:
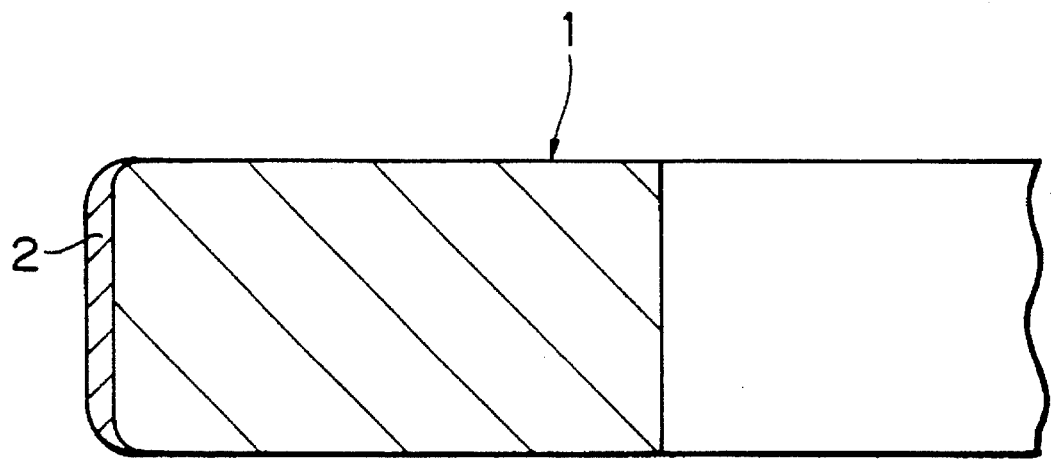
FIG. 1 is a longitudinal sectional view showing a part of a piston ring of one preferred embodiment of the present invention.

FIG. 1 is a longitudinal sectional view showing a part of a piston ring of one preferred embodiment of the present invention. A piston ring 1 of this embodiment has a rectangular cross section formed of steel, cast iron, titanium or titanium alloy. A hard film 2 is formed on the outer circumferential surface of the piston ring 1 by means of arc ion plating.

The hard film 2 comprises 1 to 25 percent by weight of chromium, 4 to 15.5 percent by weight of nitrogen, and the remainder of molybdenum, and includes at least molybdenum nitride ($Mo_xN_y$) and chromium nitride ($Cr_xN_y$). The film hardness is a Vickers hardness of 1600 to 2600 and the film crystal grain size is less than 1 μm. A thickness for the hard film 2 is preferably 5 μm to 80 μm.

The chromium content for the above preferably has a lower limit of 5 percent and upper limit of 15 percent by weight. The nitrogen content preferably has a lower limit of 6.5 percent and an upper limit of 13.0 percent by weight.

The Vickers hardness of the film preferably has a lower limit of 1700 and an upper limit of 2400.

The crystal grain size of the molybdenum nitride and chromium nitride forming the film is preferably less than 0.1 μm.

The said hard film can be applied by the physical vapor deposition process. Vacuum deposition, sputtering or ion plating is used in physical vapor deposition.

The ion plating process can be used for instance to coat the said hard film by providing at least two evaporating sources inside an ion plating apparatus from among an evaporating source of molybdenum metal, an evaporating source of chromium metal, and an evaporating source of Mo—Cr alloy, setting the proper amount of arc current for each evaporating source, and performing the ion plating in a nitrogen atmosphere. The hard film can also be coated by utilizing one evaporating source comprised of a specified percentage of Mo—Cr alloy and performing ion plating in a nitrogen atmosphere.

The sliding member of this embodiment has superior wear resistance due to the ternary film of Mo—Cr—N including molybdenum nitride and chromium nitride, and also has superior toughness due to the chromium nitride.

When the chromium content within the film is less than 1 percent by weight, there is no improvement in the toughness of the molybdenum nitride and when the chromium content exceeds 25 percent by weight, the wear resistance declines.

When the nitrogen content within the film is less than 4 percent by weight or exceeds 15.5 percent by weight, the toughness of the film declines.

When the film hardness exceeds a Vickers hardness of 2600, the toughness of the film declines. When the Vickers hardness of the film falls below 1600, the toughness of the film declines and the amount of wear on the film increases and the wear resistance declines.

When the crystal grain size of the molybdenum nitride and the chromium nitride forming the hard film is 1 μm or more, sliding members have poor resistance to peeling at the sliding portions and poor film adhesion.

The arc ion plating process is one type of ion plating, wherein a film material of the evaporating source (cathode) is vaporized, ionized by vacuum arc discharge to form a film on the surface of the substrate. This arc ion plating process is characterized by a high ionization rate of the vapor allowing forming of a highly adhesive, high density film.

Figure 2:
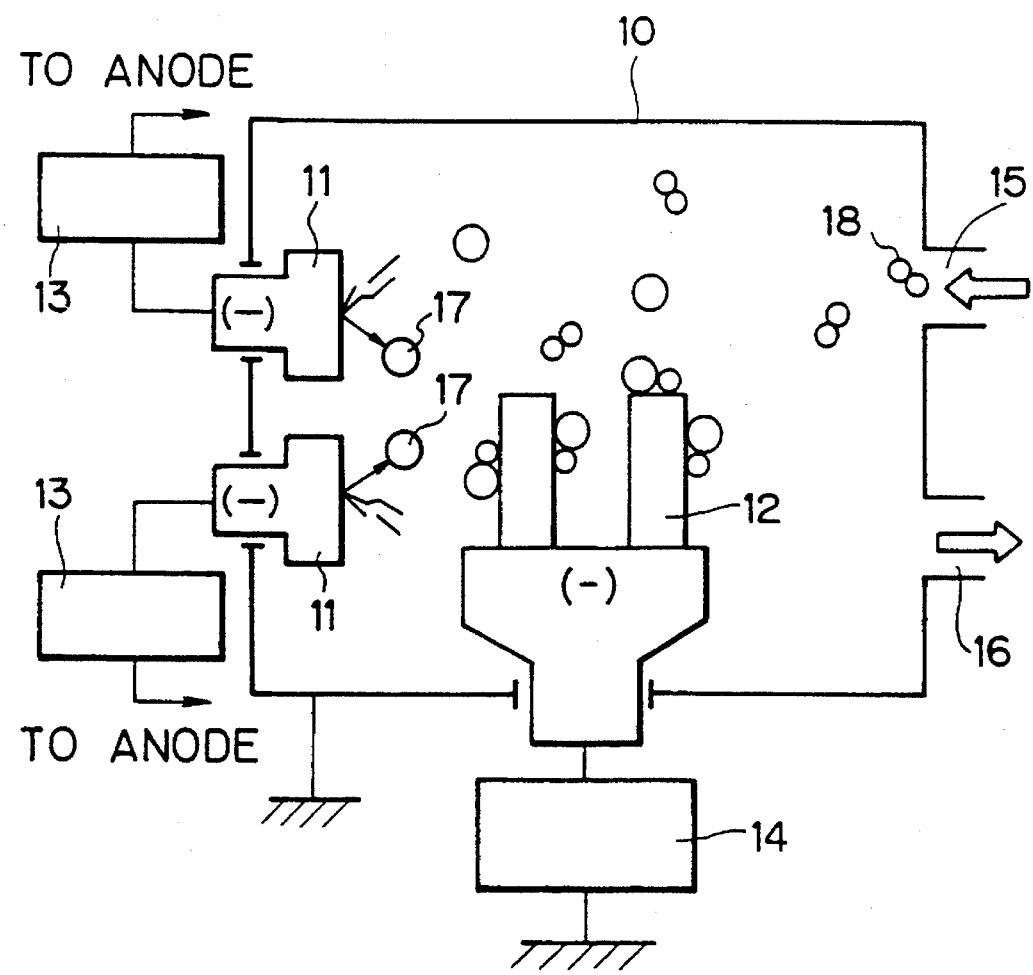
FIG. 2 is a view illustrating a configuration of an arc ion plating apparatus.

A basic configuration of an arc ion plating apparatus will be described with reference to FIG. 2. A cathode (evaporating source) 11 composed of a film material and a substrate 12 on which film is formed, are mounted in a vacuum chamber 10. The cathode 11 is connected to an arc supply source 13 installed outside the vacuum chamber 10, and an anode (not shown) in the figure is connected to the arc supply source 13. A negative bias voltage is applied to the substrate 12 by a bias voltage supply source 14. The vacuum chamber 10 is provided with a gas inlet 15 connected to process gas supply source and a discharging outlet 16 connected to a pump.

Accordingly, at the start of arc discharge between the cathode 11 and the anode in the vacuum chamber 10, the arc concentrates into a point (arc spot) on the surface of the cathode 11, and moves around randomly and fast on the surface of the cathode 11. The energy of the arc current (several tens of amperes to several hundreds of amperes) concentrated in the arc spot instantaneously evaporates and ionizes the material of the cathode 11 to generate metallic ions 17 released into the vacuum space. Then, a negative bias voltage which is applied to the substrate 12 accelerates the metallic ions 17 to tightly adhere together with reactive gases 18 on the surface of the substrate 12, producing an extremely fine coating.

In the said arc ion plating apparatus of this embodiment, at least two cathodes (evaporating sources) are provided inside the vacuum chamber 10, from among a cathode (evaporating source) of molybdenum metal, a cathode (evaporating source) of chromium metal, and a cathode (evaporating source) of Mo—Cr alloy (Two cathodes are shown in the figure). Using nitrogen gas as the process gas, a hard film can be formed on the piston ring (substrate 12). The said hard film comprises 1 to 25 percent by weight of chromium, 4 to 15.5 percent by weight of nitrogen, and the remainder of molybdenum, and includes at least molybdenum nitride ($Mo_xN_y$) and chromium nitride ($Cr_xN_y$). The film hardness is a Vickers hardness of 1600 to 2600 and the film crystal grain size is less than 1 μm. The amount of the arc current for each cathode (evaporating source) 11 can be adjusted separately.

Figure 3:
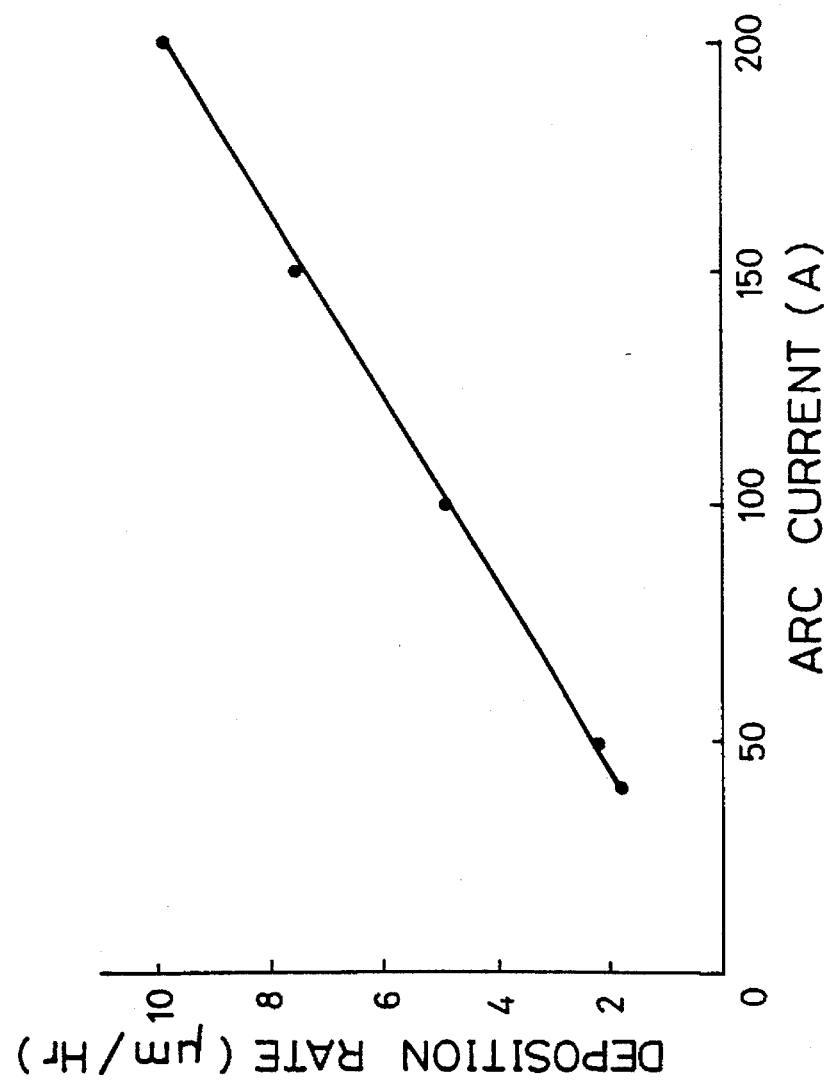
FIG. 3 is a graph showing the relation of arc current to deposition rate.

The constituent amounts of chromium and molybdenum used in the above can be determined as described next. FIG. 3 is a graph showing the relation of arc current to deposition rate. The setup in FIG. 3 uses molybdenum metal as the material of the cathode (evaporating source) and a bias voltage of 30 volts. However, the results were largely the same when chromium metal or Mo—Cr alloy was used as the material of the cathode (evaporating source). As shown in FIG. 3, the deposition rate, in other words the cathode (evaporating source) evaporation amount rises in proportion to an increase in the arc current (40 amperes to 200 amperes). An arc cannot be generated if the arc current is 40 amperes or less.

As made clear above, the evaporation amount of the cathode (evaporating source) can be adjusted by changing the amount of arc current. Accordingly, regulating the constituent amounts of molybdenum and chromium can be performed by adjusting the amount of arc current in each cathode (evaporating source). The amount of the arc current in each cathode (evaporating source) to match the molybdenum and chromium content can be easily determined based on FIG. 3, the figure (see FIG. 11) corresponding to FIG. 3 for a chromium metal evaporating source, and the figure (not shown but with results largely identical to FIG. 3 as mentioned above) corresponding to FIG. 3 for the Mo—Cr alloy evaporating source.

Table 1 lists the cathode (evaporating source) materials and provides specific examples of arc current amounts for each type cathode.

TABLE 1

|  | No. 1 Cathode (Evaporating Source) Molybdenum metal | No. 2 Cathode (Evaporating Source) Mo—Cr (20 wt. %) alloy | Mo:Cr (wt. ratio) |
| --- | --- | --- | --- |
| Example 1 | 200A | 200A | 9:1 |
| Example 2 | 200A | 100A | 19:1 |
| Example 3 | 200A | 50A | 39:1 |

The nitrogen content can be regulated by adjusting the nitrogen atmosphere inside the vacuum chamber 10, within a pressure range of 0 to 20 mTorr.

The hardness of the film can be adjusted during ion plating by controlling the bias voltage within a range of 5 to 200 volts. Hardness increases as the bias voltage is raised.

The types of tests performed for evaluating the wear resistance and the toughness of the hard film are described next.

Tables 2, 3 and 4 show the constituents of the hard film, the chromium content, the nitrogen content and the film hardness used in the film toughness test, the wear resistance test and the durability test. The constituent of the film other than chromium and nitrogen was molybdenum. The crystal grain size of the molybdenum nitride, chromium nitride, molybdenum and chromium forming the film was under 0.1 μm.

TABLE 2

| No. | Film constituents | Cr content (wt. %) | N content (wt. %) | Film hardness (HV) |
|---|---|---|---|---|
| Comparative Example | | | | |
| 1 | molybdenum nitride | 0 | 10.0 | 2800 |
| 2 | molybdenum nitride | 0.6 | 10.0 | 2720 |
| 3 | molybdenum nitride chromium nitride molybdenum | 26.6 | 10.0 | 1610 |
| 4 | chromium nitride molybdenum chromium | 10.0 | 3.5 | 1550 |
| 5 | molybdenum nitride chromium nitride | 10.0 | 16.0 | 2320 |
| 6 | molybdenum nitride chromium nitride molybdenum | 25.0 | 6.0 | 1460 |
| 7 | molybdenum nitride chromium nitride | 1.0 | 15.5 | 2740 |

TABLE 3

| No. | Film constituents | Cr content (wt. %) | N content (wt. %) | Film hardness (HV) |
|---|---|---|---|---|
| Embodiment | | | | |
| 1 | molybdenum nitride chromium nitride | 1.0 | 10.0 | 2570 |
| 2 | molybdenum nitride chromium nitride | 5.2 | 10.0 | 2200 |
| 3 | molybdenum nitride chromium nitride | 10.0 | 10.0 | 1800 |
| 4 | molybdenum nitride chromium nitride | 16.0 | 10.0 | 1730 |
| 5 | molybdenum nitride chromium nitride molybdenum | 25.0 | 10.0 | 1690 |
| 6 | molybdenum nitride chromium nitride molybdenum chromium | 10.0 | 4.0 | 1710 |
| 7 | molybdenum nitride chromium nitride molybdenum | 10.0 | 6.6 | 2160 |

TABLE 4

| No. | Film constituents | Cr content (wt. %) | N content (wt. %) | Film hardness (HV) |
|---|---|---|---|---|
| Embodiment | | | | |
| 8 | molybdenum nitride chromium nitride | 10.0 | 15.5 | 2240 |
| 9 | molybdenum nitride chromium nitride molybdenum | 25.0 | 6.0 | 1600 |
| 10 | molybdenum nitride chromium nitride molybdenum | 25.0 | 6.0 | 1790 |
| 11 | molybdenum nitride chromium nitride | 10.0 | 10.0 | 1950 |
| 12 | molybdenum nitride | 10.0 | 10.0 | 2090 |
| 13 | chromium nitride molybdenum nitride | 1.0 | 15.5 | 2470 |
| 14 | chromium nitride molybdenum nitride chromium nitride | 1.0 | 15.5 | 2600 |

Figure 4A:
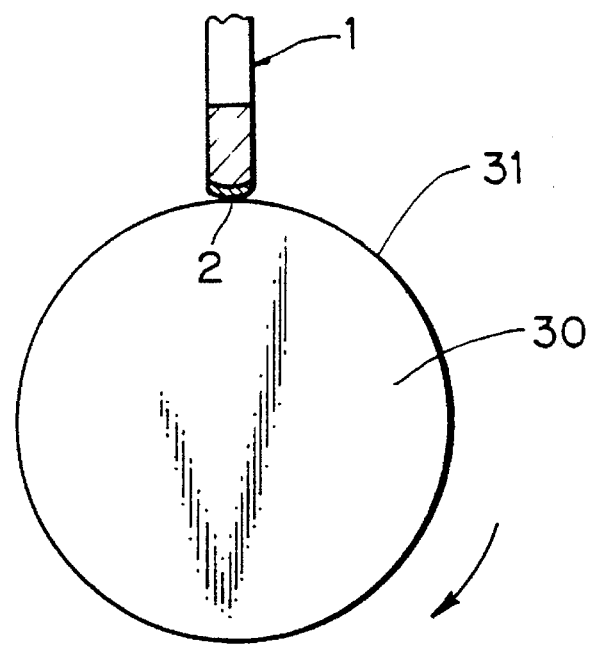
FIG. 4A is a front view partly in section showing an outline of a pin-on-cylinder friction testing machine.
Figure 4B:
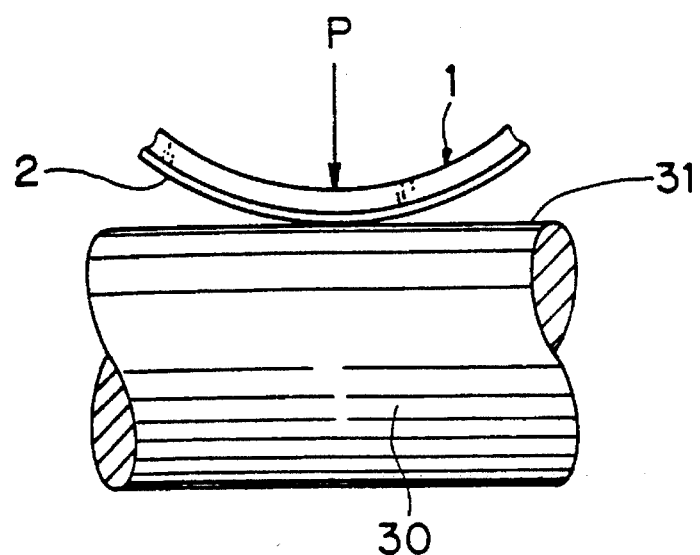
FIG. 4B is a side view showing an outline of the same friction testing machine.

A Pin-on-cylinder friction testing machine was used to evaluate the toughness of the hard film 2 and toughness tests of the film were performed. The outline of the tests performed using the Pin-on-cylinder friction testing machine are explained with reference to FIG. 4.

The piston ring 1 is mounted along an axis of a rotor 30 at the upper end of the outer circumference 31 of the rotor 30 (cast iron: JIS FC250) rotated around the horizontal axis. A load P is applied to the piston ring 1, pressing the piston ring 1 against the outer circumference 31 of the rotor 30. In this state, the rotor 30 is rotated while lubricant is supplied to the contact portion between the piston ring 1 and the rotor 30. Tests are performed with various loads and the hard film of the piston ring 1 was observed under a microscope (100×power). The load was determined as film damage load when damages (cracks or chips) were found.

Measurements were performed for the piston rings covered with the hard film shown in Tables 2, 3 and 4.

Test conditions were as follows.

Load: 50 to 180N (every 5N)

Speed: 1000 rpm

Time: 3 minutes

Lubricant: 10 W (diesel engine oil) [chromium content and cracking load]

Figure 5:
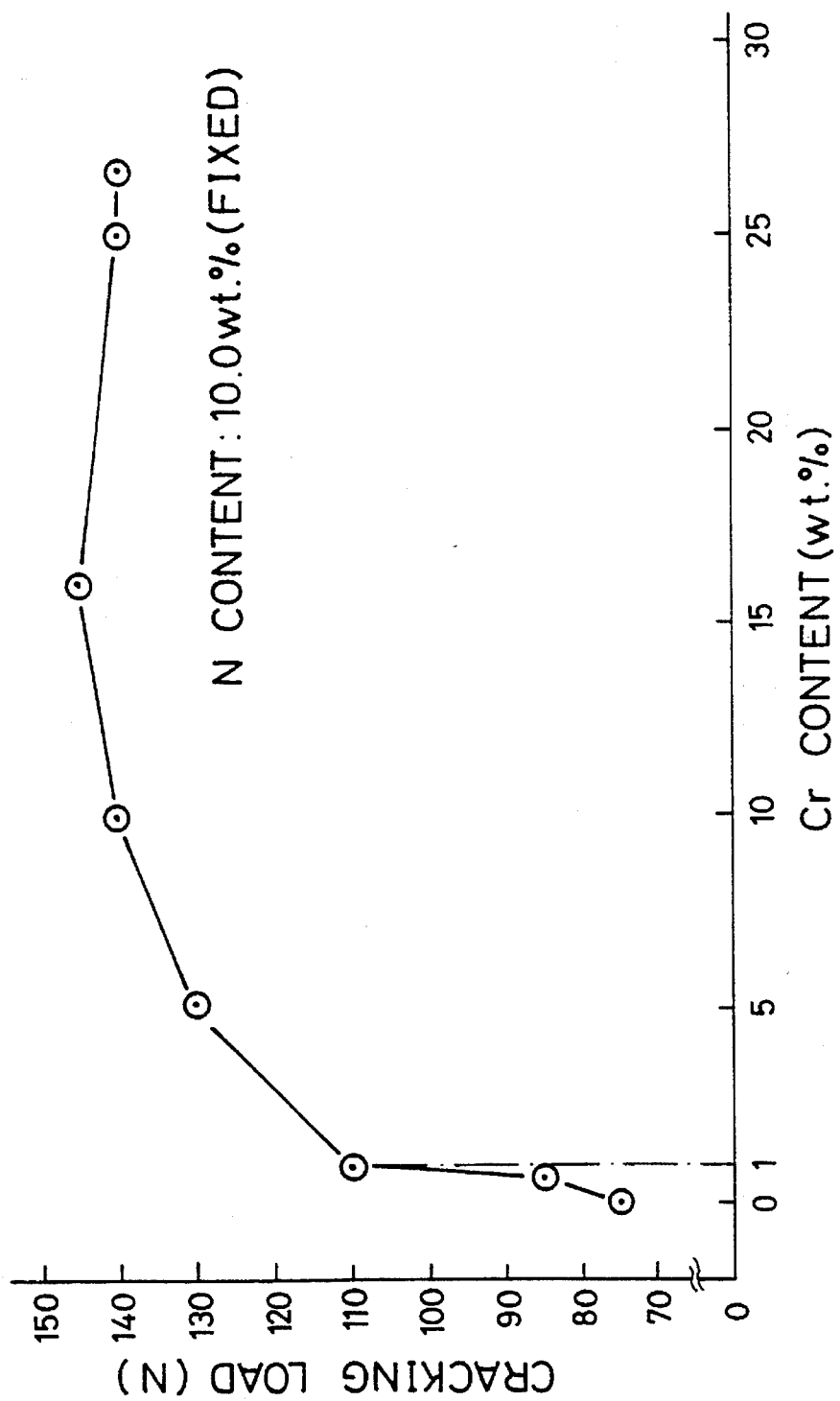
FIG. 5 is a graph showing the relation of chromium content to the cracking load.

FIG. 5 shows the results (nitrogen: 10.0%, the embodiment 3 was used for 10.0% chromium) from tests performed with the said pin-on-cylinder friction testing machine for chromium content versus the cracking load.

As can be seen from the test results in FIG. 5, when the chromium content is 1.0 percent by weight or more, it is apparent that the cracking load is large, and the film has superior toughness during sliding movement. [nitrogen content and cracking load]

Figure 6:
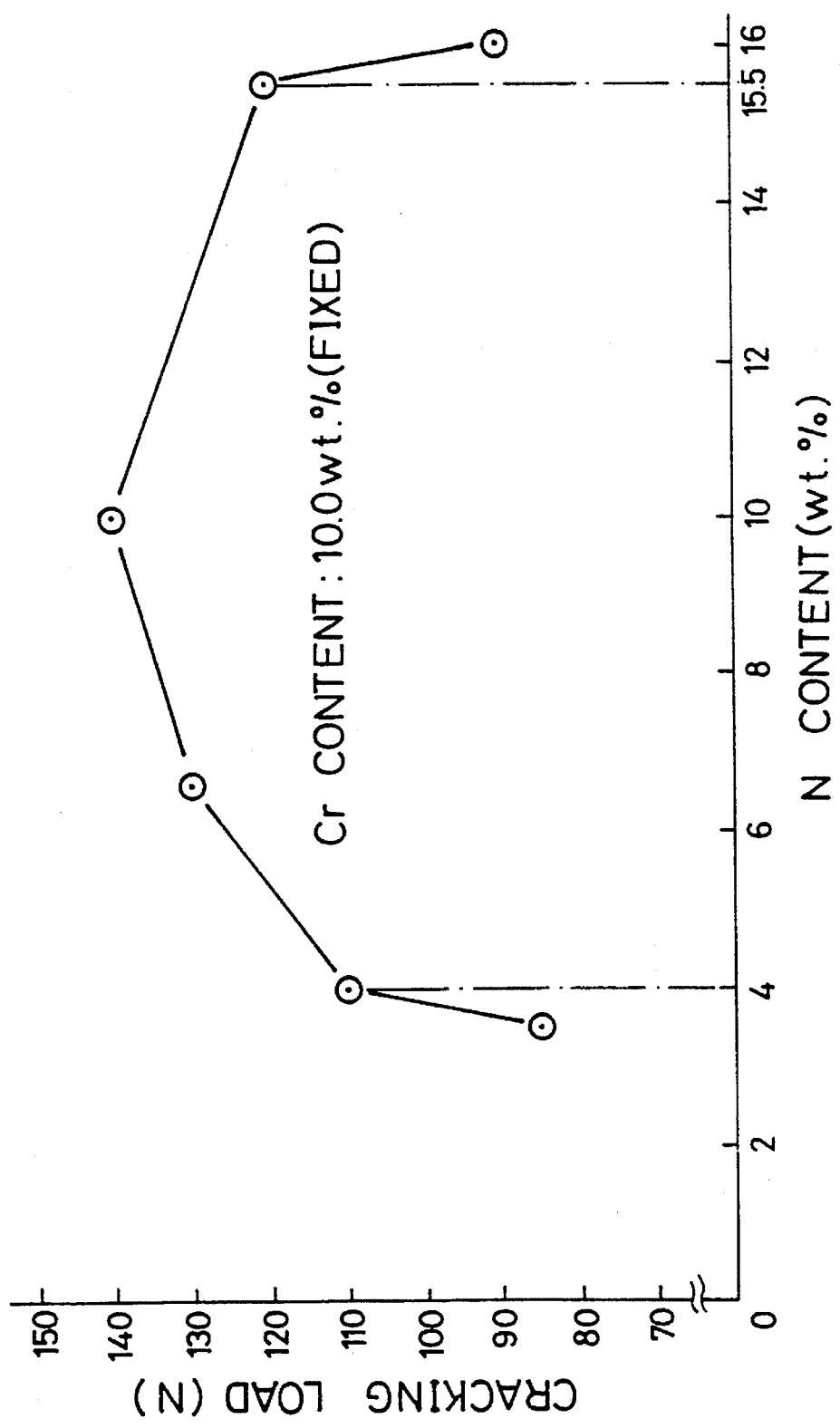
FIG. 6 is a graph showing the relation of nitrogen content to the cracking load.

FIG. 6 shows the results (chromium: 10.0%, the embodiment 3 was used for 10.0% nitrogen) from tests performed with the said pin-on-cylinder friction testing machine for nitrogen content versus the cracking load.

As can be seen from the test results in FIG. 6, when the nitrogen content is in a range of 4 to 15.5 percent by weight, it is apparent that the cracking load is large, and the film has superior toughness during sliding movement. [film hardness and cracking load]

Figure 7:
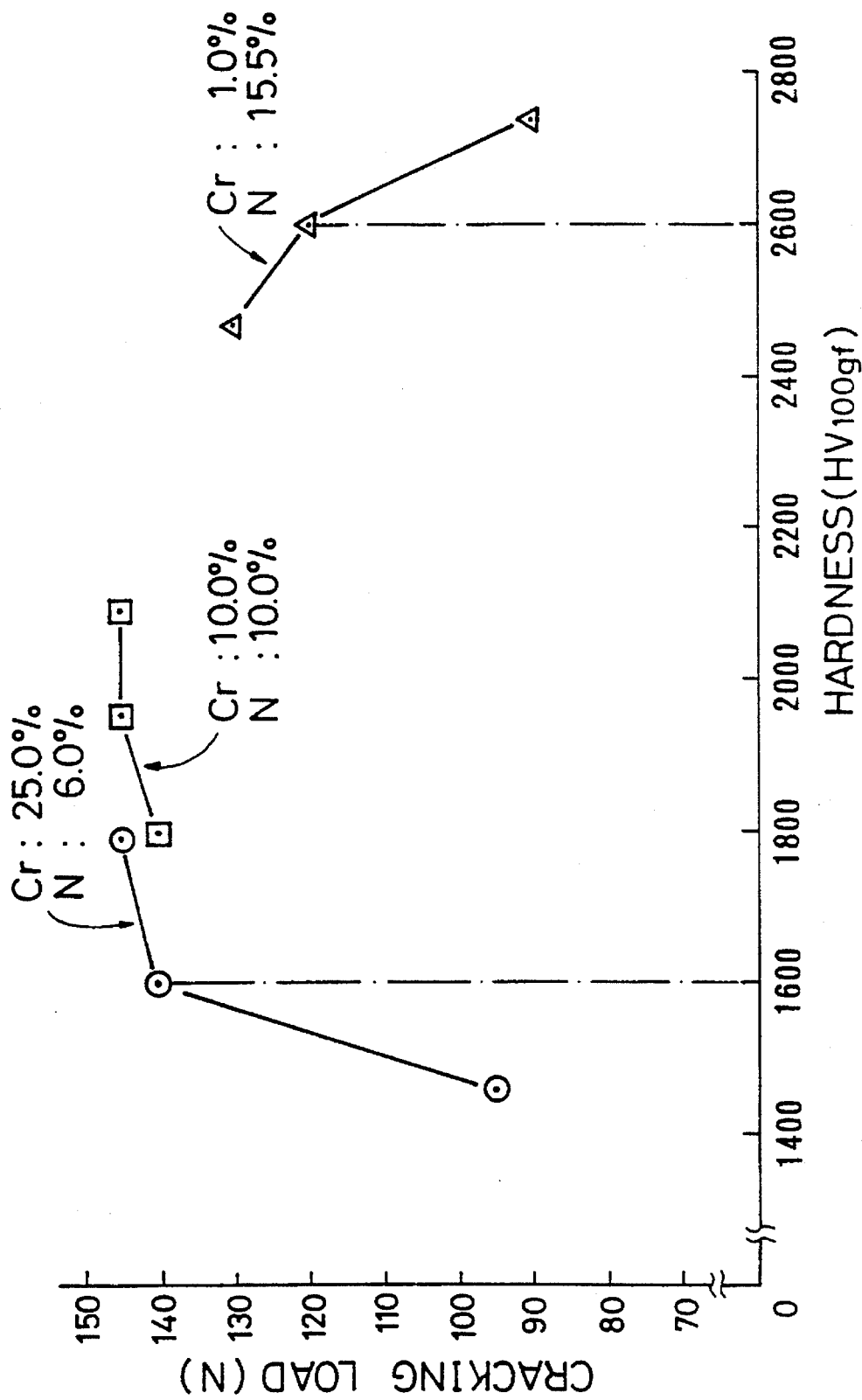
FIG. 7 is a graph showing the relation of film hardness to the cracking load.

FIG. 7 shows the results (Cr: 25.0%, N: 6.0%, Cr: 10.0%, N: 10.0%, Cr: 1.0%, N: 15.5%) from tests performed with the said pin-on-cylinder friction testing machine for film hardness versus cracking load.

As can be seen from the test results in FIG. 7, when the film hardness is in a Vickers hardness range of 1600 to 2600, it is apparent that the cracking load is large, and the film has superior toughness during sliding movement.

Figure 8:
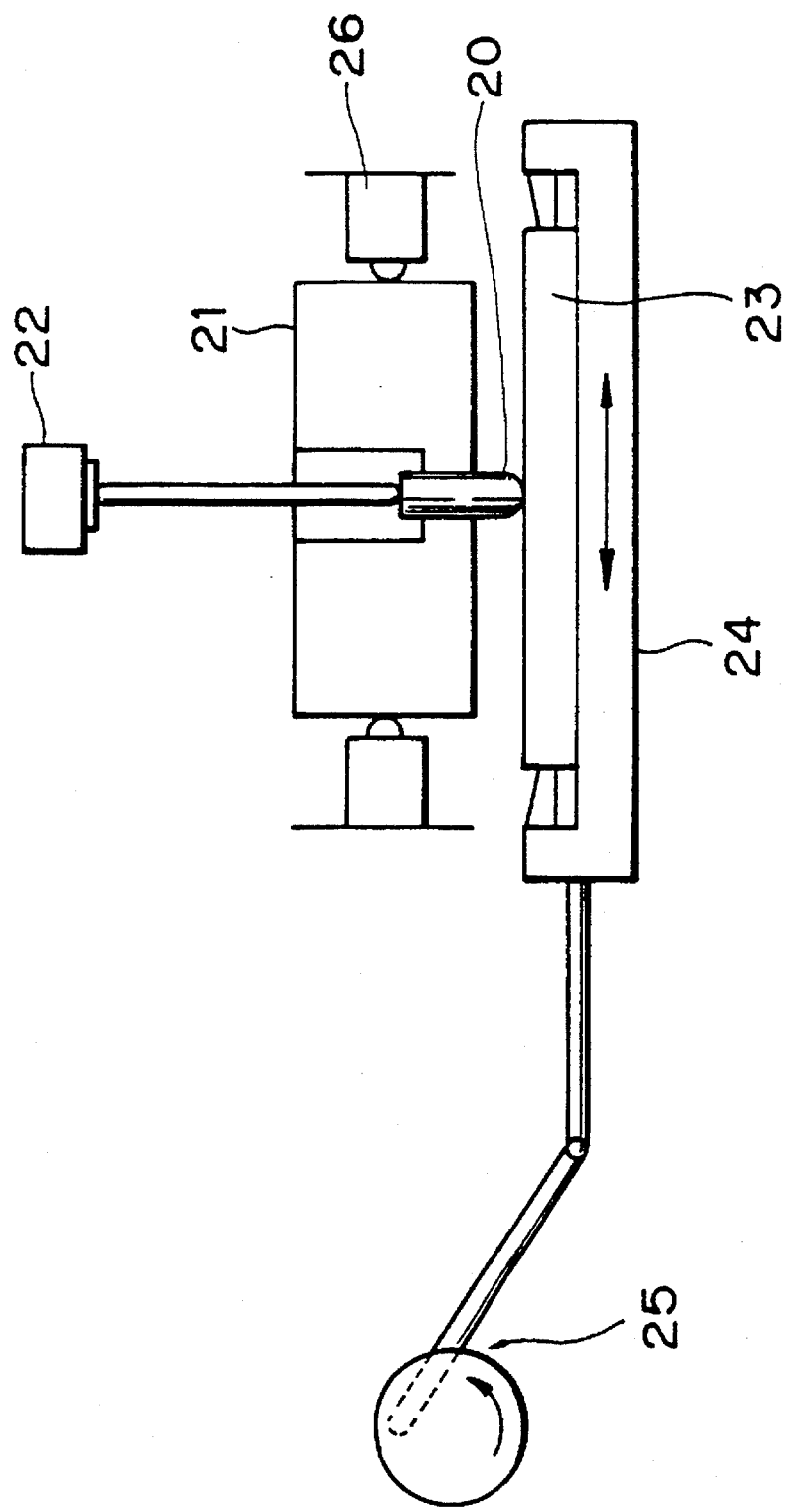
FIG. 8 is a front view showing an outline of a reciprocating friction testing machine.

Next, wear tests were performed utilizing the reciprocating friction testing machine shown in FIG. 8 in order to evaluate the wear resistance of the hard film 2.

An outline of the reciprocating friction testing machine will be described with reference to FIG. 8. An upper pin shaped test piece 20 corresponding to a piston ring, is secured by a fixed block 21, and a downward load is applied from above by a hydraulic cylinder 22 to press contact on a lower test piece 23 described later. The rectangular, level base shaped lower test piece 23 corresponding to a cylinder is held by a movable block 24 and moved back and forth by a crank mechanism 25. A load cell is denoted by the number 26.

Figure 9A:
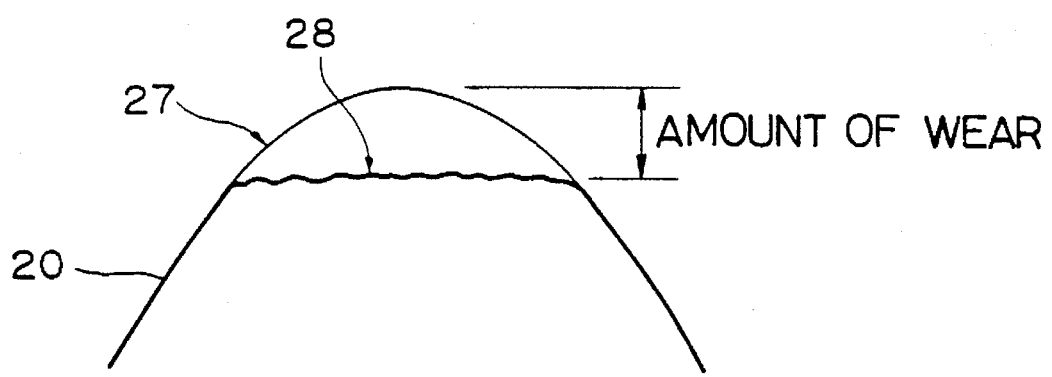
FIG. 9A is a descriptive drawing for calculating wear on an upper test piece.
Figure 9B:
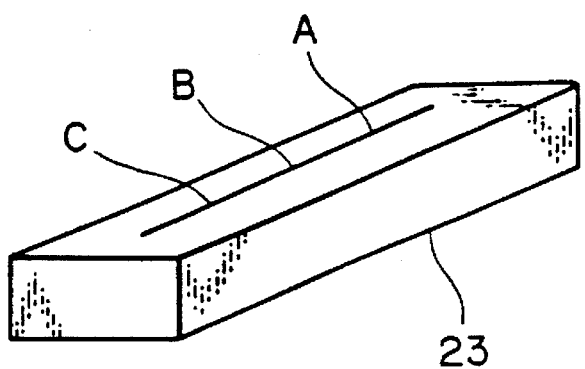
FIG. 9B is a descriptive drawing for calculating wear on a lower test piece.

The amount of wear of the upper test piece 20 as shown in FIG. 9A was determined by measuring a pre-test shape 27 and a post-test shape 28, and finding the difference between them. The amount of wear of the lower test piece 23 as shown in FIG. 9B was determined by measuring the amount of concavity at three positions A, B and C separated in the sliding portion, and showing an average value.

Test conditions were as follows.

1. Test piece

Lower test piece: The test surface of a flat plate (length 70 mm, width 17 mm, thickness 14 mm) of cast iron for cylinder block (equivalent to JIS FC250) was buff-polished to obtain a surface roughness of less 0.1 μm. The hardness was a Rockwell hardness ($H_RB$) of 90.

Upper test piece: The 18 mm radius of the end surface of the steel rod for piston ring (diameter 8 mm, length 23 mm) was spherical finished. The material of the steel rod was 17% Cr martensitic stainless steel. The surface of the steel rod was covered with the hard film listed in Tables 2, 3 and 4.

2. Wear test conditions break-in period: 50N×100 cpm×5 min
test period: 200N×600 cpm×60 min
Lubricant: Viscous oil equivalent to light oil FIG. 10 shows the results (nitrogen: 10.0%, the embodiment 3 was used for 10.0% chromium) from tests performed with the reciprocating friction testing machine.

Figure 10:
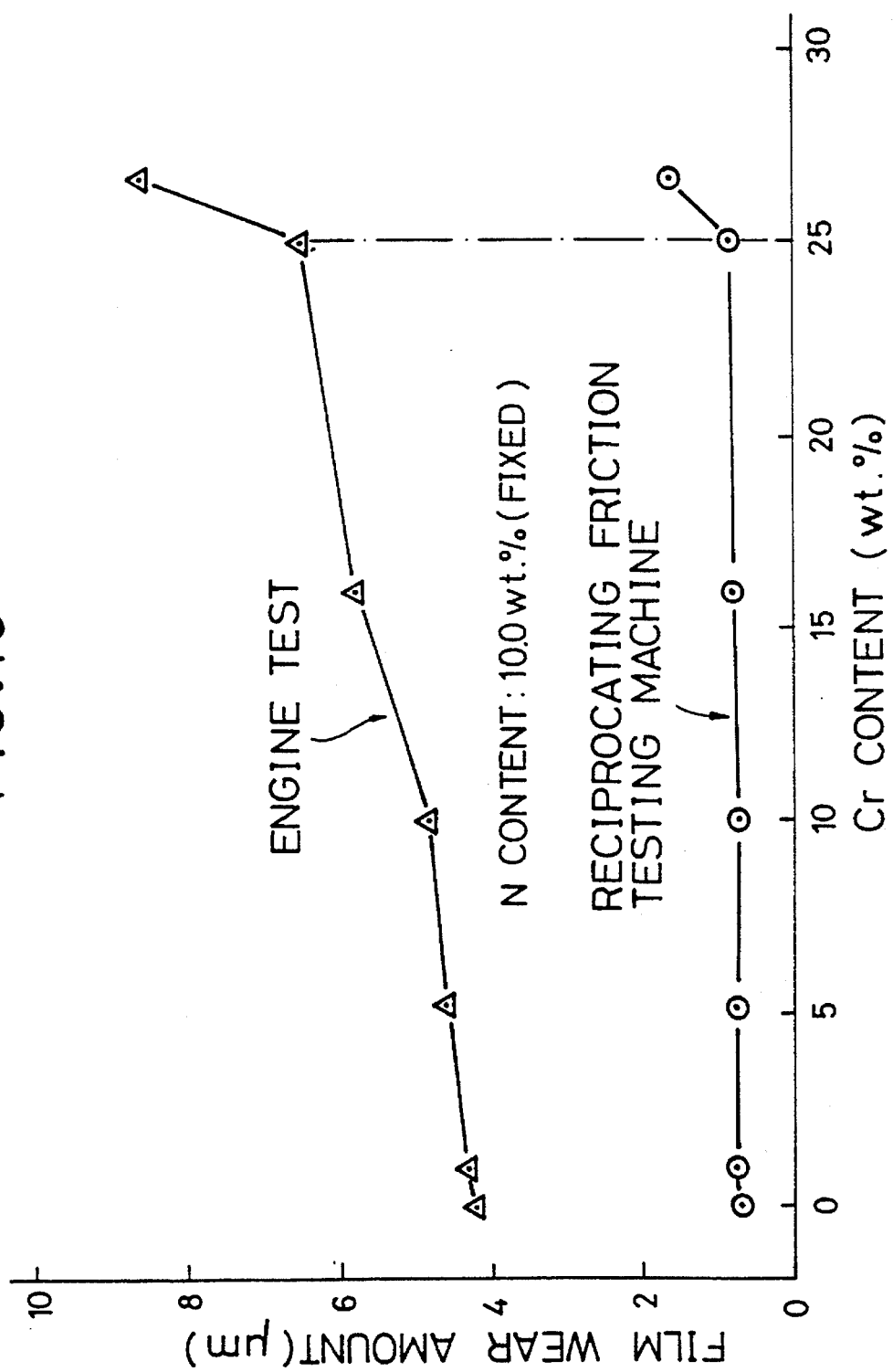
FIG. 10 is a graph showing the relation of chromium content to the amount of film wear.

As can be seen from the test results in FIG. 10, when the chromium content is 25 percent by weight or less, it is apparent that the amount of wear is small, and the film has superior wear resistance during sliding movement.

An engine test was next performed on the piston rings covered on their outer circumference with the hard films shown in Tables 2, 3 and 4. More specifically, the said piston rings were assembled into the 86 mm diameter inline, four cylinder diesel engine and durability tests under full load condition were performed for 250 hours.

FIG. 10 shows test results (nitrogen: 10.0%, the embodiment 3 was used for 10.0% chromium) when subjected to wear in the said durability tests.

As can be seen from the test results in FIG. 10, when the chromium content of the hard film is 25 percent by weight or less, it is apparent that the amount of film wear is small, and the piston ring has superior wear resistance.

The film damage results are shown in Tables 5, 6 and 7.

TABLE 5

| No. | Film constituents | Cr content (wt. %) | N content (wt. %) | Film hardness (HV) | Film damage |
|---|---|---|---|---|---|
| Comparative Example | | | | | |
| 1 | molybdenum nitride | 0 | 10.0 | 2800 | present |
| 2 | molybdenum nitride | 0.6 | 10.0 | 2720 | present |

TABLE 5-continued

| No. | Film constituents | Cr content (wt. %) | N content (wt. %) | Film hardness (HV) | Film damage |
|---|---|---|---|---|---|
| 3 | molybdenum nitride chromium nitride | 26.6 | 10.0 | 1610 | none |
| 4 | molybdenum chromium nitride molybdenum chromium | 10.0 | 3.5 | 1550 | present |
| 5 | molybdenum nitride chromium nitride | 10.0 | 16.0 | 2320 | present |
| 6 | molybdenum nitride chromium nitride | 25.0 | 6.0 | 1460 | present |
| 7 | molybdenum nitride chromium nitride | 1.0 | 15.5 | 2740 | present |

TABLE 6

| No. | Film constituents | Cr content (wt. %) | N content (wt. %) | Film hardness (HV) | Film damage |
|---|---|---|---|---|---|
| Embodiment | | | | | |
| 1 | molybdenum nitride chromium nitride | 1.0 | 10.0 | 2570 | none |
| 2 | molybdenum nitride chromium nitride | 5.2 | 10.0 | 2200 | none |
| 3 | molybdenum nitride chromium nitride | 10.0 | 10.0 | 1800 | none |
| 4 | molybdenum nitride chromium nitride | 16.0 | 10.0 | 1730 | none |
| 5 | molybdenum nitride chromium nitride molybdenum chromium | 25.0 | 10.0 | 1690 | none |
| 6 | molybdenum nitride chromium nitride molybdenum chromium | 10.0 | 4.0 | 1710 | none |
| 7 | molybdenum nitride chromium nitride molybdenum | 10.0 | 6.6 | 2160 | none |

TABLE 7

| No. | Film constituents | Cr content (wt. %) | N content (wt. %) | Film hardness (HV) | Film damage |
|---|---|---|---|---|---|
| Embodiment | | | | | |
| 8 | molybdenum nitride chromium nitride | 10.0 | 15.5 | 2240 | none |
| 9 | molybdenum nitride chromium nitride molybdenum | 25.0 | 6.0 | 1600 | none |
| 10 | molybdenum nitride chromium nitride molybdenum | 25.0 | 6.0 | 1790 | none |
| 11 | molybdenum nitride chromium nitride | 10.0 | 10.0 | 1950 | none |
| 12 | molybdenum nitride chromium nitride | 10.0 | 10.0 | 2090 | none |
| 13 | molybdenum nitride chromium nitride | 1.0 | 15.5 | 2470 | none |
| 14 | molybdenum nitride chromium nitride | 1.0 | 15.5 | 2600 | none |

As can be seen from the test results in Tables 5, 6 and 7, the piston ring having the hard film of this embodiment generated no cracks or chips and provided superior toughness.

Another embodiment of this invention is shown next. The piston ring of this embodiment is different in a hard film from the piston ring of the above mentioned embodiment.

The hard film 2 comprises 5 to 58 percent by weight of molybdenum, 7 to 22 percent by weight of nitrogen, and the remainder of chromium, and includes at least chromium nitride ($Cr_xN_y$) and molybdenum nitride ($Mo_xN_y$). The film hardness is a Vickers hardness of 1400 to 2500 and the film crystal grain size is less than 1 μm. A thickness for the hard film 2 is preferably 5 μm to 80 μm.

The molybdenum content for the above preferably has a lower limit of 15 percent and an upper limit of 50 percent by weight. The nitrogen content preferably has a lower limit of 14 percent.

The Vickers hardness of the film preferably has a lower limit of 1600 and an upper limit of 2400.

The crystal grain size of the chromium nitride and molybdenum nitride forming the film is preferably less than The said hard film can be applied by the physical vapor deposition process, the same as hard film covering of the said previous embodiment. Vacuum deposition, sputtering or ion plating is used in physical vapor deposition.

The ion plating process can be used for instance to coat the said hard film by providing at least two evaporating sources inside the ion plating apparatus from among an evaporating source of chromium metal, an evaporating source of molybdenum metal, and an evaporating source of Cr—Mo alloy, setting the proper amount of arc current for each evaporating source, and performing the ion plating in a nitrogen atmosphere. The hard film can also be coated by utilizing one evaporating source comprised of a specified percentage of Cr—Mo alloy and performing ion plating in a nitrogen atmosphere.

The sliding member of this embodiment has superior wear resistance due to the ternary film of Cr—Mo—N including chromium nitride and molybdenum nitride, and also has superior toughness due to the chromium nitride. A thick film can also be provided.

When the molybdenum content within the film is less than 5 percent by weight, the wear resistance is poor, and when the molybdenum content exceeds 58 percent by weight, the film adhesion declines.

When the nitrogen content within the film is less than 7 percent by weight, the wear resistance is poor due to an increase in metallic elements, and when the nitrogen content exceeds 22 percent by weight, the adhesion of the film declines.

When the film hardness exceeds a Vickers hardness of 2500, the scuffing resistance of the film declines. When the Vickers hardness falls below 1400, the amount of wear on the film increases along with a decline in the scuffing resistance.

When the crystal grain size of the chromium nitride and the molybdenum nitride forming the hard film is 1 μm or more, sliding members have poor resistance to peeling at the sliding portions and have poor film adhesion.

In the said arc ion plating apparatus of this embodiment, at least two cathodes (evaporating sources) are provided inside the vacuum chamber 10, from among a cathode (evaporating source) of chromium metal, a cathode (evaporating source) of molybdenum metal, and a cathode (evaporating source) of Cr—Mo alloy (Two cathodes are shown in the figure). Using nitrogen gas as the process gas, a hard film can be formed on the piston ring (substrate 12). The said hard film comprises 5 to 58 percent by weight of molybdenum, 7 to 22 percent by weight of nitrogen, and the remainder of chromium, and includes at least chromium nitride ($Cr_xN_y$) and molybdenum nitride ($Mo_xN_y$). The film hardness is a Vickers hardness of 1400 to 2500 and the film crystal grain size is less than 1 μm. The amount of the arc current for each cathode (evaporating source) 11 can be adjusted separately.

Figure 11:
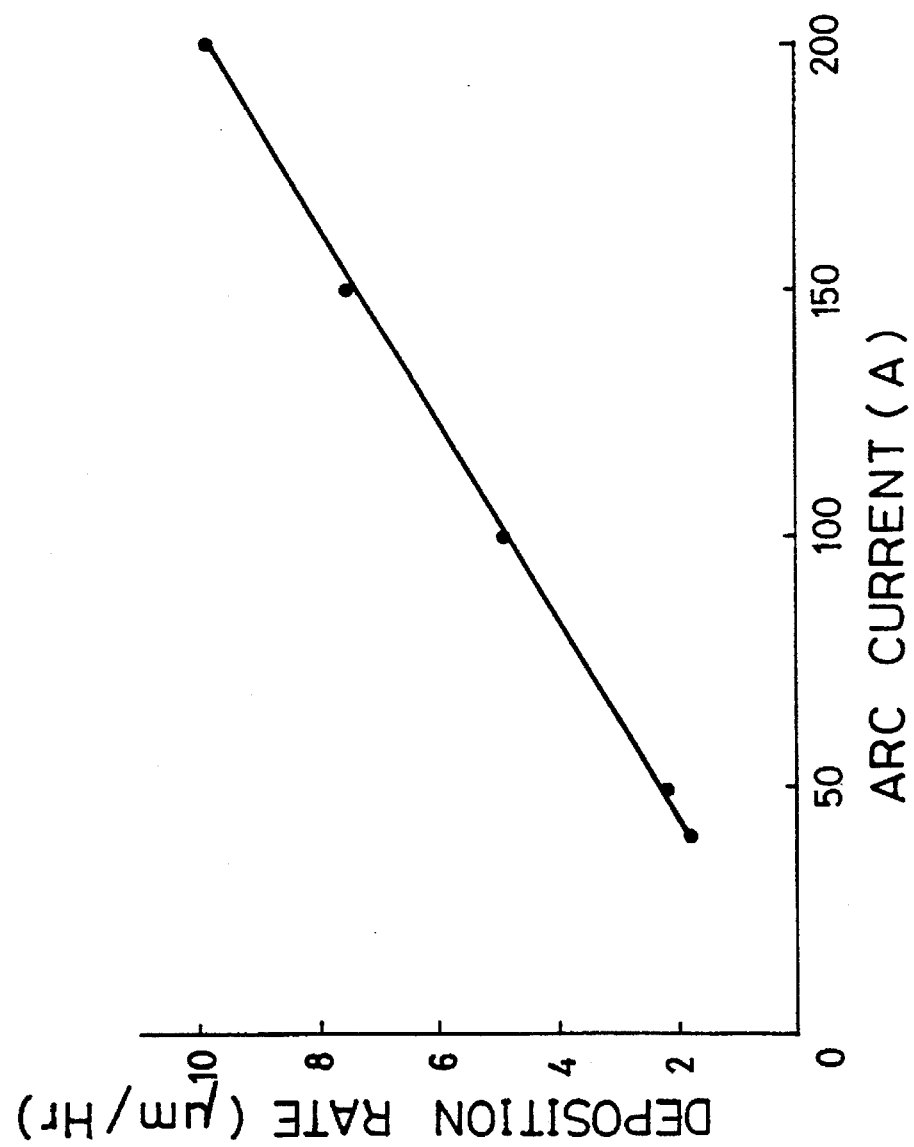
FIG. 11 is a graph showing the relation of arc current to deposition rate.

The constituent amounts of chromium and molybdenum used in the above can be determined as described next. FIG. 11 is a graph showing the relation of arc current to deposition rate. The setup in FIG. 11 uses chromium metal as the material of the cathode (evaporating source) and has a bias voltage of 30 volts. However, the results were largely the same when molybdenum metal or Cr—Mo alloy was used as the material of the cathode (evaporating source). As shown in FIG. 11, the deposition rate, in other words the cathode (evaporating source) evaporation amount rises in proportion to an increase in the arc current (40 amperes to 200 amperes). An arc cannot be generated if the arc current is 40 amperes or less.

As made clear above, the evaporation amount of the cathode (evaporating source) can be adjusted by changing the amount of arc current. Accordingly, regulating the constituent amounts of chromium and molybdenum can be performed by adjusting the amount of arc current in each cathode (evaporating source). The amount of the arc current in each cathode (evaporating source) to match the chromium and molybdenum content can be easily determined based on FIG. 3 for the molybdenum evaporating source, FIG. 11 for the chromium evaporating source, and the figure (not shown but with results largely identical to FIG. 11 as mentioned above) corresponding to FIG. 11 for the Cr—Mo alloy evaporating source.

Table 8 lists the cathode (evaporating source) materials and provides specific examples of arc current amounts for each type cathode.

TABLE 8

|  | No. 1 Cathode (Evaporating Source) Chromium metal | No. 2 Cathode (Evaporating Source) Cr—Mo (40 wt. %) alloy | Cr:Mo (wt. ratio) |
| --- | --- | --- | --- |
| Example 1 | 200A | 200A | 8:2 |
| Example 2 | 200A | 100A | 13:2 |
| Example 3 | 200A | 50A | 23:2 |

The nitrogen content can be regulated by adjusting the nitrogen atmosphere inside the vacuum chamber 10, within a pressure range of 1 to 20 mTorr.

The hardness of the film can be adjusted during ion plating by controlling the bias voltage within a range of 3 to 200 volts. Hardness increases as the bias voltage is raised.

The types of tests performed for evaluating the wear resistance and the toughness and adhesion of the hard film are described next.

Tables 9 and 10 show the constituents of the hard film, the molybdenum content, the nitrogen content and the film hardness used in the wear resistance test, the expansion test and the scuffing resistance test. The constituent of the film other than molybdenum and nitrogen was chromium. The crystal grain size of the chromium nitride, molybdenum nitride, chromium and molybdenum forming the film was under 0.1 μm.

TABLE 9

| No. | Film constituents | Mo content (wt. %) | N content (wt. %) | Film hardness (HV) |
| --- | --- | --- | --- | --- |
| Comparative Example |  |  |  |  |
| 8 | chromium nitride | 0 | 15.0 | 1690 |
| 9 | chromium nitride molybdenum nitride | 3.5 | 15.0 | 1730 |
| 10 | chromium nitride molybdenum nitride | 68.0 | 15.0 | 2460 |
| 11 | chromium nitride molybdenum nitride molybdenum | 28.5 | 5.0 | 1640 |
| 12 | chromium nitride molybdenum nitride | 28.5 | 24.0 | 2010 |
| 13 | chromium nitride molybdenum nitride chromium molybdenum | 5.0 | 7.0 | 1320 |
| 14 | chromium nitride molybdenum nitride | 58.0 | 22.0 | 2570 |

TABLE 10

| No. | Film constituents | Mo content (wt. %) | N content (wt. %) | Film hardness (HV) |
| --- | --- | --- | --- | --- |
| Embodiment |  |  |  |  |
| 15 | chromium nitride molybdenum nitride | 5.0 | 15.0 | 1790 |

TABLE 10-continued

| No. | Film constituents | Mo content (wt. %) | N content (wt. %) | Film hardness (HV) |
| --- | --- | --- | --- | --- |
| 16 | chromium nitride molybdenum nitride | 28.5 | 15.0 | 1800 |
| 17 | chromium nitride molybdenum nitride | 58.0 | 15.0 | 2380 |
| 18 | chromium nitride molybdenum nitride molybdenum | 28.5 | 7.0 | 1720 |
| 19 | chromium nitride molybdenum nitride | 28.5 | 22.0 | 1950 |
| 20 | chromium nitride molybdenum nitride chromium molybdenum | 5.0 | 7.0 | 1400 |
| 21 | chromium nitride molybdenum nitride chromium molybdenum | 5.0 | 7.0 | 1530 |
| 22 | chromium nitride molybdenum nitride | 28.5 | 15.0 | 1710 |
| 23 | chromium nitride molybdenum nitride | 28.5 | 15.0 | 1930 |
| 24 | chromium nitride molybdenum nitride | 58.0 | 22.0 | 2400 |
| 25 | chromium nitride molybdenum nitride | 58.0 | 22.0 | 2500 |

Wear resistance tests of the film were performed with the reciprocating friction testing machine as shown in FIG. 8 in order to evaluate the wear resistance of the hard film 2.

The amount of wear on the upper test piece and the lower test piece was determined in the same manner as in the previous embodiment.

Test conditions were as follows.
1. Test piece

Lower test piece: The test surface of a flat plate (length 70 mm, width 17 mm, thickness 14 mm) of cast iron for cylinder block (equivalent to JIS FC250) was buff-polished to obtain a surface roughness of less 0.1 μm. The hardness was a Rockwell hardness ($H_RB$) of 90.

Upper test piece: The 18 mm radius of the end surface of the steel rod for piston ring (diameter 8 mm, length 23 mm) was spherical finished. The material of the steel rod was 17% Cr martensitic stainless steel. The surface of the steel rod was covered with the hard film listed in Tables 9 and 10.
2. Wear test conditions break-in period: 50N×100 cpm×5 min test period: 200N×600 cpm×60 min Lubricant: Viscous oil equivalent to light oil [molybdenum content and wear resistance]

Figure 12:
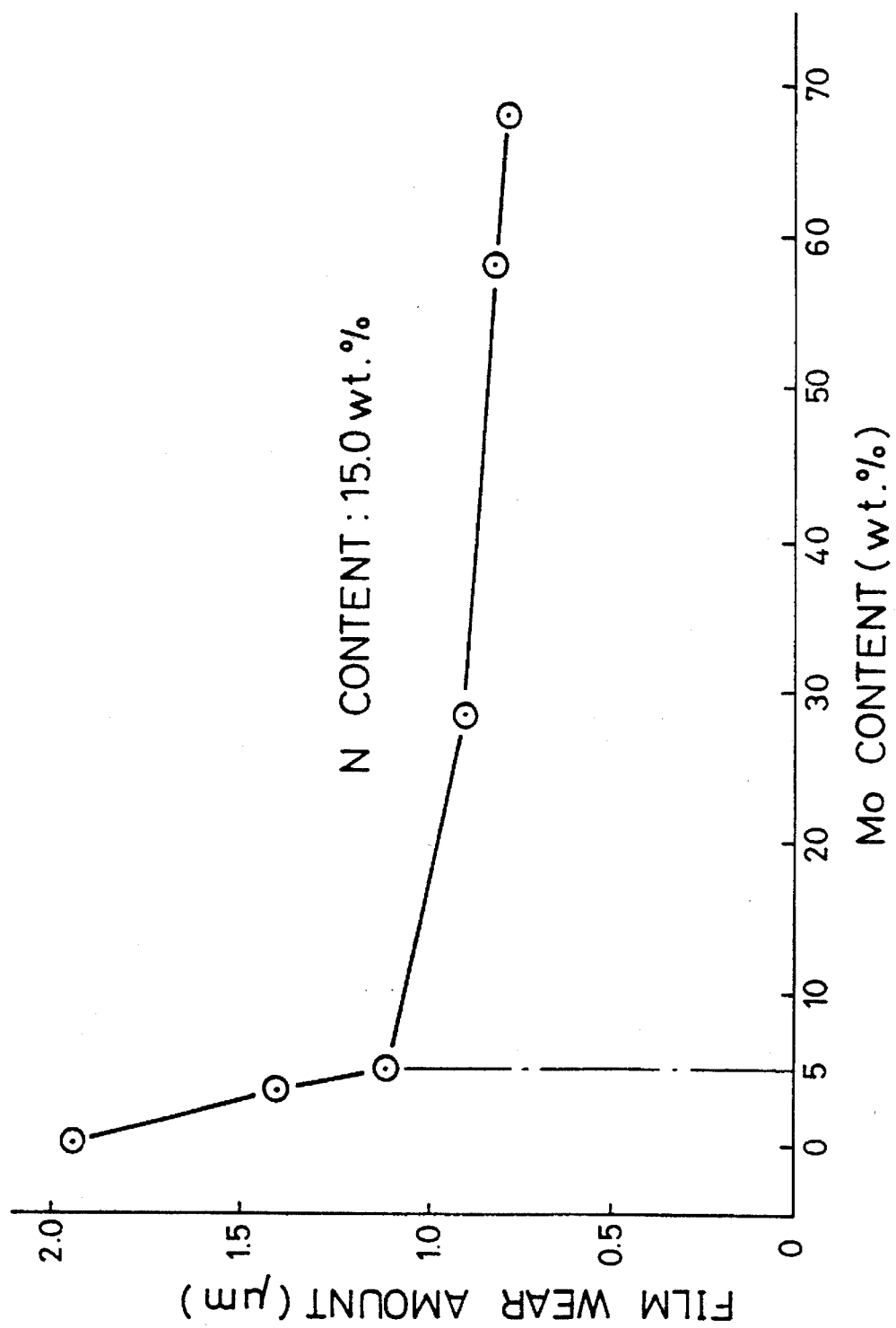
FIG. 12 is a graph showing the relation of molybdenum content to the amount of film wear.

FIG. 12 shows the results (nitrogen: 15.0%, the embodiment 16 was used for 28.5% molybdenum) from tests performed with the said reciprocating friction testing machine for molybdenum content versus film wear.

As can be seen from the test results in FIG. 12, when the molybdenum content is 5.0 percent by weight or more, it is apparent that the amount of wear is small, with superior wear resistance during sliding movement. [nitrogen content and wear resistance]

Figure 13:
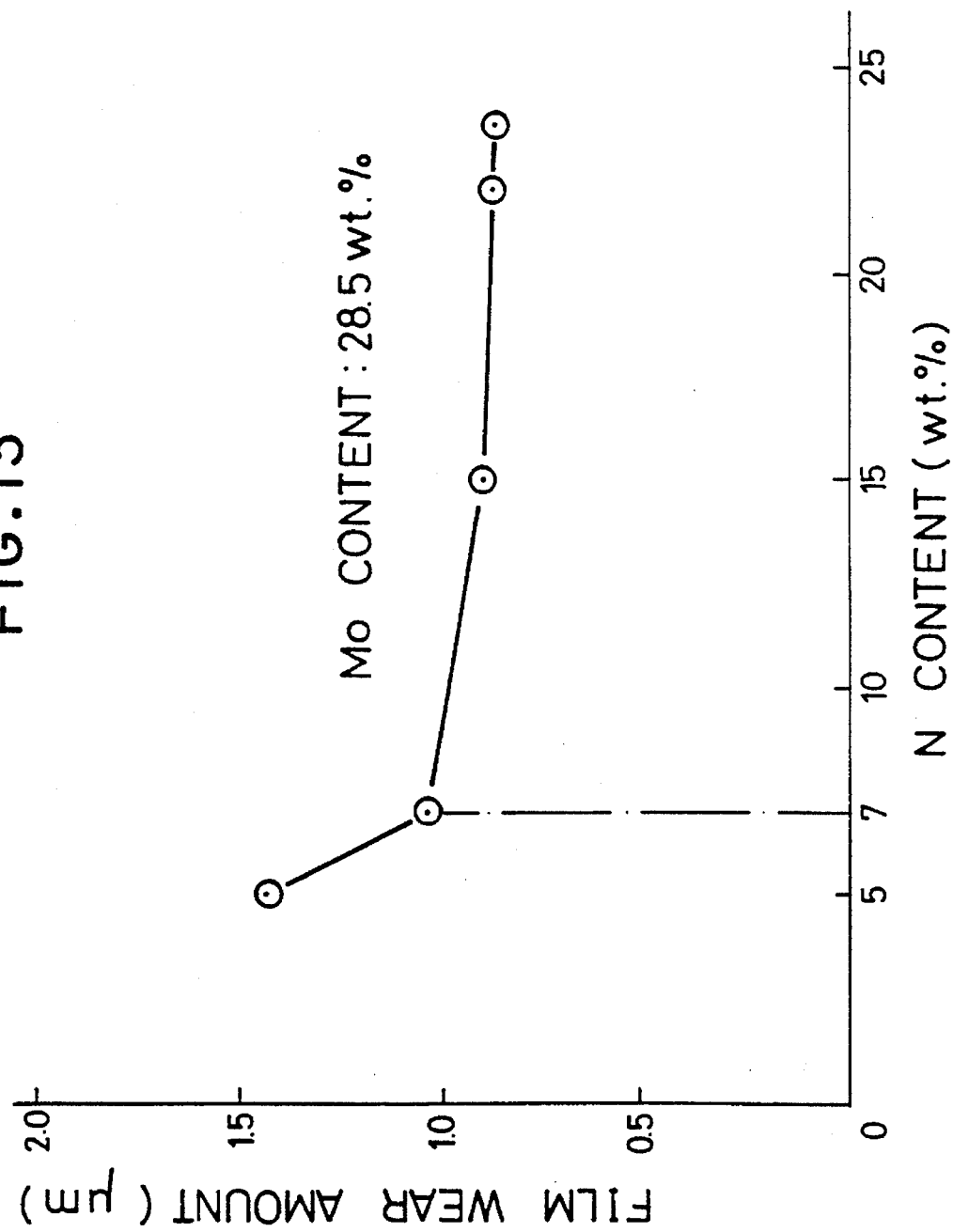
FIG. 13 is a graph showing the relation of nitrogen content to the amount of film wear.

FIG. 13 shows the results (molybdenum: 28.5%, the embodiment 16 was used for 15.0% nitrogen) from tests performed with the said reciprocating friction testing machine for nitrogen content versus the amount of film wear.

As can be seen from the test results in FIG. 13, when the nitrogen content is 7.0 percent by weight or more, the amount of wear is small, with superior wear resistance during sliding movement.

An expansion test was next performed to evaluate the adhesion of the hard film 2. The piston rings used in the expansion test were as follows.

Material : 17% Cr martensitic stainless steel
Nominal diameter : 86 mm
Width in axial direction: 2.0 mm
Thickness in radial direction: 3.0 mm A nitrided layer was formed on the surface of the said piston ring and the hard film (film thickness: 50 μm) as listed in Tables 9 and 10 was then applied to cover the nitrided layer on the outer circumferential surface.

Figure 14:
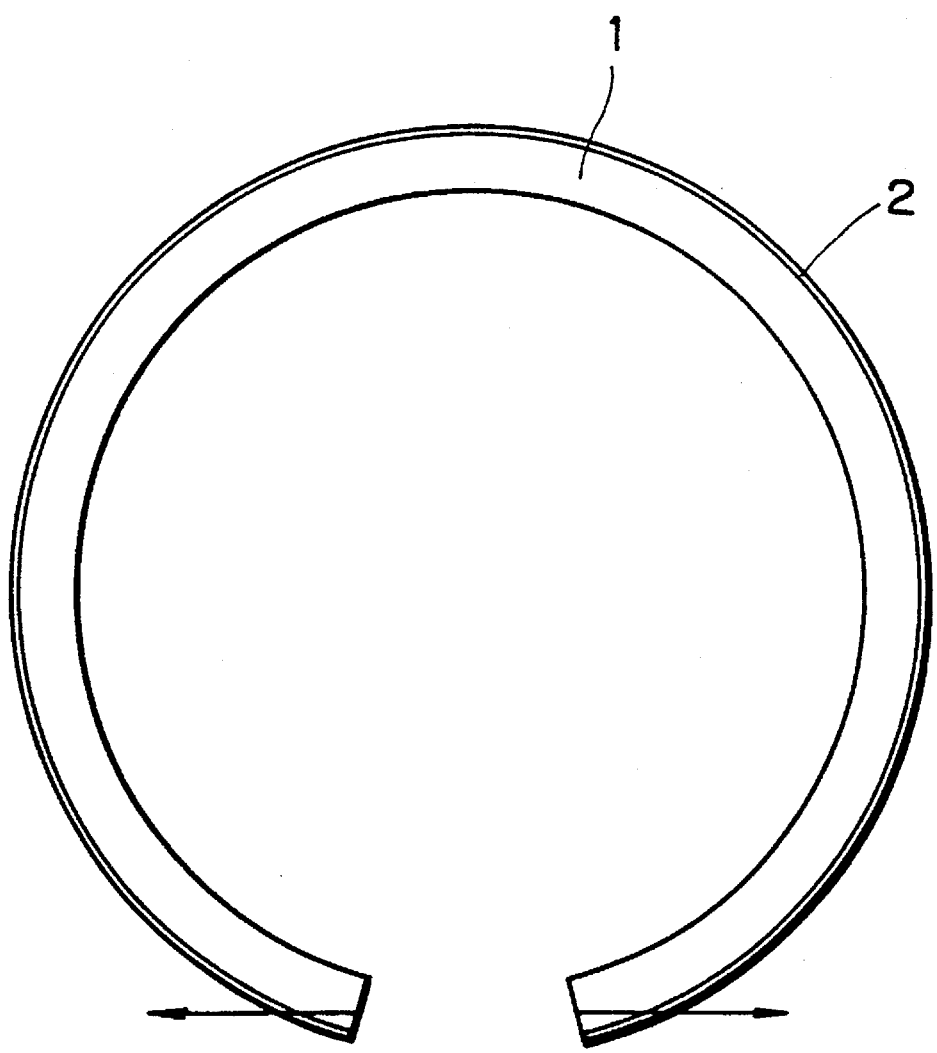
FIG. 14 is a drawing showing a piston ring for describing the expansion test.

In the expansion test as shown in FIG. 14, the gap between both ends of the piston ring 1 was expanded to 60 mm, and the amount of expansion (gap between end surfaces of both ends) was measured when peeling occurred on the hard film 2. [molybdenum content and expansion strength]

Figure 15:
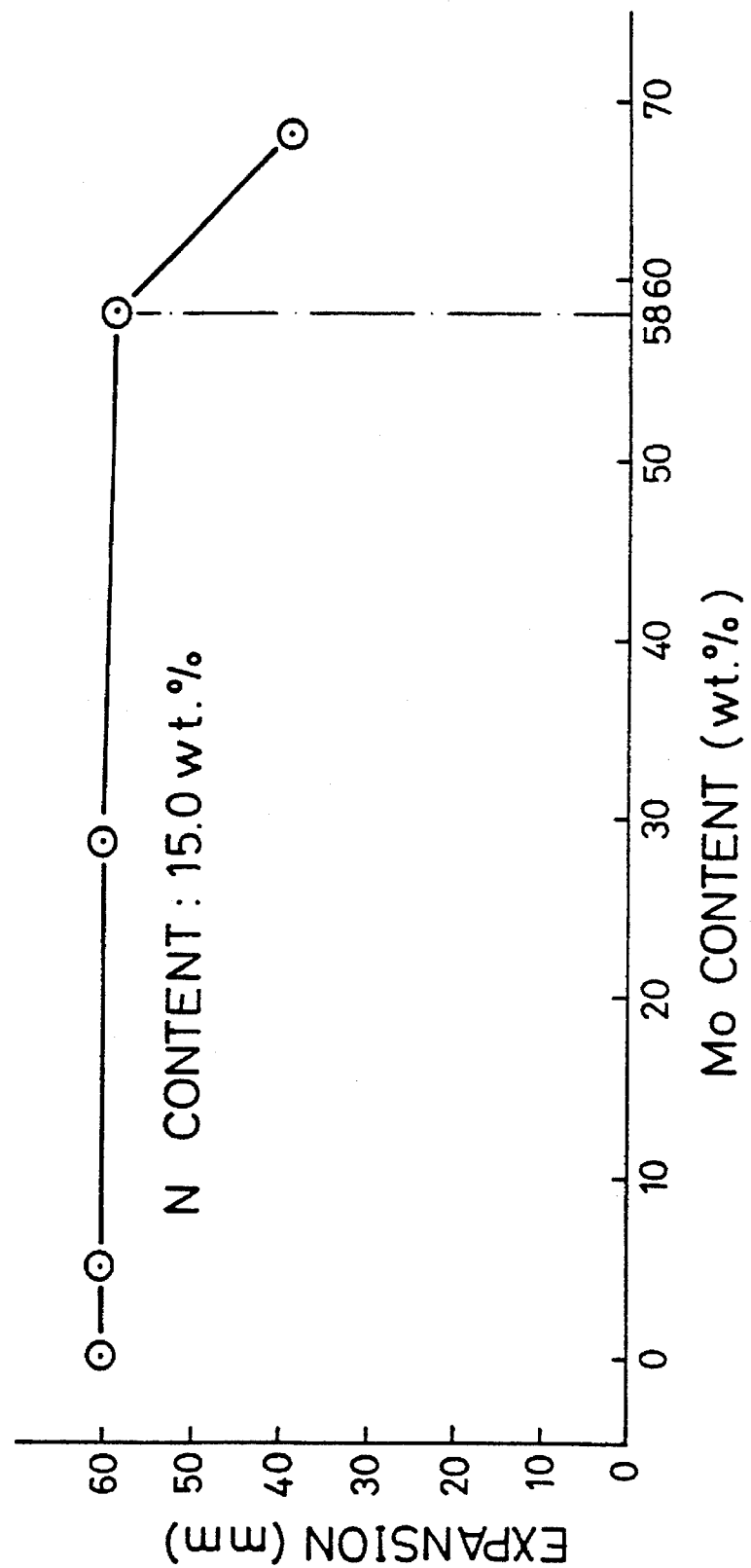
FIG. 15 is a graph showing the relation of molybdenum content to the amount of expansion.

FIG. 15 shows the test results from the said expansion test (nitrogen: 15.0%, the emodiment 16 was used for 28.5% molybdenum) for molybdenum content versus expansion amount.

As the test results in FIG. 15 show, when the molybdenum content is 58 percent by weight or less, it is apparent that the expansion amount is large and the film has superior adhesion. [nitrogen content and expansion strength]

FIG. 16 shows the test results from the said expansion test (molybdenum: 28.5%, the embodiment 16 was used for 15.0% nitrogen) for nitrogen content versus expansion amount.

As the test results in FIG. 16 show, when the nitrogen content is 22 percent by weight or less, it is apparent that the expansion amount is large and the film has superior adhesion.

Scuffing resistance tests for the film hardness were performed next using the said reciprocating friction testing machine.

The test piece was the same as for the wear resistance test. The scuffing test conditions were as follows.

Load : initial 200N (step-up at 20N/min.)
Speed: 100 cpm
Lubricant: Viscous oil equivalent to light oil 25 μl FIG. 17 shows the said scuffing test results for film hardness versus scuffing loads (Mo 5.0%, N 7.0%, Mo 28.5%, N 15.0%, Mo 58.0%, N 22.0%).

As shown in the test results in FIG. 17, it is apparent that the scuffing load is large when the film hardness is in a Vickers range of 1400 to 2500.

The above two said embodiments showed examples in which the outer circumferential surface of the piston ring was covered with a hard film, however the hard film may also be coated on the outer circumferential surface, and the upper and lower surfaces, or the outer circumferential surface, the upper and lower surfaces and the inner circumferential surface of the piston ring.

In the aforesaid preferred embodiments, although the hard film is applied to the piston ring, the hard film is not limited to piston ring applications. The hard film may be applied to cover at least the sliding surface of other sliding members, for example, a tappet or a cam used as a valve driving member in an internal combustion engine.

What is claimed is:

1. A sliding member having a hard film covering at least the sliding surface of said sliding member, said hard film being a ternary film comprising molybdenum, chromium, and 4 to 22 percent nitrogen by weight, and including at least molybdenum nitride and chromium nitride, and having a Vickers hardness of 1400 to 2600, and having the film crystal grain size of less than 1 μm.

2. A sliding member as claimed in claim 1, in which said hard film comprises 1 to 25 percent by weight of chromium, 4 to 15.5 percent by weight of nitrogen and the remainder of molybdenum, and has a Vickers hardness of 1600 to 2600.

3. A sliding member as claimed in claim 1, in which said hard film comprises 5 to 58 percent by weight of molybdenum, 7 to 22 percent by weight of nitrogen and the remainder of chromium, and has a Vickers hardness of 1400 to 2500.

* * * * *